United States Patent [19]

Gordon

[11] 4,386,117

[45] May 31, 1983

[54] COATING PROCESS USING ALKOXY SUBSTITUTED SILICON-BEARING REACTANT

[76] Inventor: Roy G. Gordon, Cambridge, Mass.

[21] Appl. No.: 323,249

[22] Filed: Nov. 20, 1981

[51] Int. Cl.³ ............................................ C03C 17/245
[52] U.S. Cl. .................................... 427/109; 427/95; 427/160; 427/167
[58] Field of Search ................... 427/109, 160, 167, 95

[56] References Cited

U.S. PATENT DOCUMENTS 4,187,336  2/1980  Gordon ................................. 427/34
4,206,252  6/1980  Gordon ............................... 427/160

Primary Examiner—James R. Hoffman
Attorney, Agent, or Firm—Andrew F. Kehoe

[57] ABSTRACT

An improved process for chemical vapor deposition of coatings of the type bearing silicon oxide or silicon oxide/tin oxide mixtures. The process involves the use of mono- or di-alkoxy terminated permethylpolysilanes, preferably monomethoxypentamethyldisilane, as a silicon-donating reactant. Also disclosed are novel transparent silicon-bearing coating compositions which can be formed by the improved process to have any desired refractive index value from about 1.44 to about 2.0.

17 Claims, 3 Drawing Figures

COATING PROCESS USING ALKOXY SUBSTITUTED SILICON-BEARING REACTANT

BACKGROUND OF THE INVENTION

This invention relates to the formation of silicon-bearing material, particularly to the formation of coatings by thermal decomposition, and reaction with oxygen, of silicon-bearing reactants carried in the vapor phase to a hot surface on which the coating is deposited.

The most pertinent published art is disclosed in U.S. Pat. Nos. 4,187,336 and 4,206,252 and the teaching of these patents are incorporated by reference herein. In general, they relate to the formation of transparent silicon-oxide bearing coatings by the oxidation of silanes, sometimes in combination with other materials such as tin compounds to obtain coatings of a particular refractive index. Such coatings have application, for example, as anti-iridescent interlayers on a glass substrate beneath sub-micron-thick coatings of infra-red-reflective materials such as fluorine-doped tin oxide.

In the published art, the silanes which are utilized included such materials as:

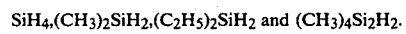

$SiH_4, (CH_3)_2SiH_2, (C_2H_5)_2SiH_2$ and $(CH_3)_4Si_2H_2$.

These materials provided highly satisfactory coatings. However, they had flammability characteristics and oxygen sensitivity that required special consideration in storage, handling and use. Silane ($SiH_4$) is spontaneously flammable in air, and while the other silanes listed are not spontaneously flammable, they do absorb and react with oxygen from the air, on standing. In the use of those silanes for chemical vapor deposition of films, their high flammability can lead to uncontrolled reactions and undesirable formation of powder, unless reaction conditions are carefully controlled. Therefore, it was decided to search for less flammable substitute materials which would still provide suitable silicon-bearing coatings. Despite the decreased oxidation susceptibility of any substitute reactant compounds, it would be necessary for them to permit achievement of favorable reaction at rates which are suitable for continuous coating processes, e.g. coating rates which are practical for use on float glass production lines.

Simultaneous oxidation of silanes and a tin-containing compound, such as tetramethyltin, produces mixed silicon-tin oxide coatings which are not spatially uniform in composition or refractive index. This differential reactivity can be applied to advantage, as in U.S. Pat. No. 4,206,252, to produce anti-iridescent gradient coatings. However, in other applications, as in U.S. Pat. No. 4,187,336, homogeneous layers of more uniform composition and refractive index are desirable. It has proven difficult to find a silicon material whose reactivity closely matches that of tetramethyltin, and would thus oxidize simultaneously with tetramethytin to produce coatings of homogeneous refractive index.

SUMMARY OF THE INVENTION

Therefore it is a principle objective of the invention to provide a process for applying thin coatings, e.g. submicron thick infra-red-reflective coatings, on glass substrates utilizing iridescent-suppressing, silicon-bearing interlayers on said glass.

Another object of the invention is to provide a process for depositing optically homogeneous layers whose refractive index can be set at any desired value between about 1.44 and about 2.0.

Another object of the invention is to provide a process for forming thin, transparent silicon-bearing coatings using less flammable reactants.

A further object of the invention is to provide a process wherein the decrease in oxidation - susceptibility of the reactants manifests itself in the overall kinetics relating to desirable coating reactions and decreased side-reactions forming powder and/or haze.

Still another object of the invention was to find a method to increase coating speed and decrease production cost while achieving the aforesaid improvement relating to flammability.

Other objectives of the invention will be obvious to those skilled in the art on reading this disclosure.

It was also discovered during work directed to achievement of the foregoing objectives, that novel coatings having silicon-carbon bonds, as well as silicon-oxygen bonds, formed during the process. These coatings are characterized by entirely suitable properties of transparency, durability and refractive index and, indeed, appear to be advantageous in some respects, over the silicon-oxide type coatings of the prior art.

The above objects are substantially achieved by utilizing alkoxyperalkylpolysilanes wherein at least one terminal silicon bears an alkoxy group. It is advantageous that the compounds be monomethoxypermethylpolysilanes having one terminal silane bearing a methoxy group. Thus favored compounds would be of the formula:

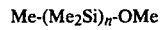

$Me\text{-}(Me_2Si)_n\text{-}OMe$ wherein n is 2 to about 10. The most suitable kinetics for formation of thin, silicon-bearing, anti-iridescent coatings appear to be achieved using compounds wherein n is 2 to 6. The compound with n=2 (a disilane) is preferred for its greater volatility and ease of synthesis. When n is 10 or more, the vapor pressure is too low to be convenient in most operations. However, the exact minimum chain length useful for obtaining a coating will depend on the effort made to obtain proper volatilization. For example, evaporation into an inert carrier gas diluent before mixing in air would allow a higher evaporation temperature—and consequently use of higher boiling reactants. The tendency towards premature oxidation at a given temperature would be reduced by such dilution. The process of the invention may be carried out by depositing of silicon-bearing films or, as is often desirable in optical applications, in codeposition with tin-oxide or other such oxides which can be formed by co-oxidation of various reactants with the favored silicon-bearing materials.

It is believed that the lower flammability is achieved because of the lack of silicon hydrogen bonds. It has been found that one result of this reduced reactivity is the capability of using gaseous reaction mixtures with higher concentrations of the silicon-bearing material. Moreover, it has been found that higher temperatures can be utilized in the reaction zone. These factors allow faster coating procedures than heretofore practical for continuous coating procedures at advantageous commercial rates of deposition. Moreover, the improvement in the desirable reaction rate is achieved without the usually-encountered commensurate risk of undesirable side reactions: It has been found that uncontrolled reactions resulting in haze on a transparent glass substrate or powder deposition can be more easily avoided using the reaction mixtures disclosed herein.

As indicated above, analysis of some coatings formed by the process of the invention indicate, surprisingly, that the silicon has some silicon-carbon bonds remaining even when it is in the finished anti-iridescence interlayer. Nevertheless such coatings are entirely useful in anti-iridescence applications. The chemical composition of the deposited coating may be considered to be a novel kind of mixture of silica ($SiO_2$) and a methyl silicone-type polymer $(Me_2SiO)_n$.

The refractive index of such silica-silicone coatings has been measured to be about 1.44. This value is intermediate between the refractive index value for silica, typically 1.45 to 1.46, and the values 1.38 to 1.41 typical of methyl silicone polymers.

Coatings with higher refractive may be produced, according to this invention, by co-oxidizing an alkoxypolysilane with an oxidizable tin compound, such as a tetraalkyltin. In this way, mixed silica-silicone-tin oxide coatings can be formed with refractive index anywhere from 1.44 to about 2.0. A preferred combination of reactants for such co-deposition, uses methoxypentamethyldisilane and tetramethyltin. Mixed vapors of these materials were discovered to oxidize in air at approximately equal rates, to yield clear, transparent coatings on surfaces heated to about 500° C. to 600° C. The refractive index of such co-deposited layers is approximately a linear function of the mole percent of tin atoms, out of the total of tin plus silicon atoms in the vapor phase, as shown in FIG. 3. Thus, by suitable formation of the reactant mixture, a uniform homogeneous transparent layer can be formed with any desired refractive index in the indicated range.

The methoxy reactants used in the present invention allow the use of reaction temperatures above 570° C., e.g. to temperatures as high as about 620° C. Moreover the concentrations of the methoxy gas can be raised above 0.4% in the reaction mixture, e.g. to about 0.5% and higher. The ability to operate safely at such concentrations and temperatures provides the opportunity to deposit substantially more coating per unit time. Indeed, using the process of the invention, it is possible to attain coating rates of from about 60 to 150 angstroms per second or higher without excessive risk from readily inflammable compositions. Rates from about 80 angstroms per second to about 125 angstroms per second appear to be optimum.

ILLUSTRATIVE EXAMPLE OF THE INVENTION

In this application and accompanying drawings there is shown and described a preferred embodiment of the invention and suggested various alternatives and modifications thereof, but it is to be understood that these are not intended to be exhaustive and that other changes and modifications can be made within the scope of the invention. These suggestions herein are selected and included for purposes of illustration in order that others skilled in the art will more fully understand the invention and the principles thereof and will be able to modify it and embody it in a variety of forms, each as may be best suited in the condition of a particular case.

IN THE DRAWINGS

Figure 1:
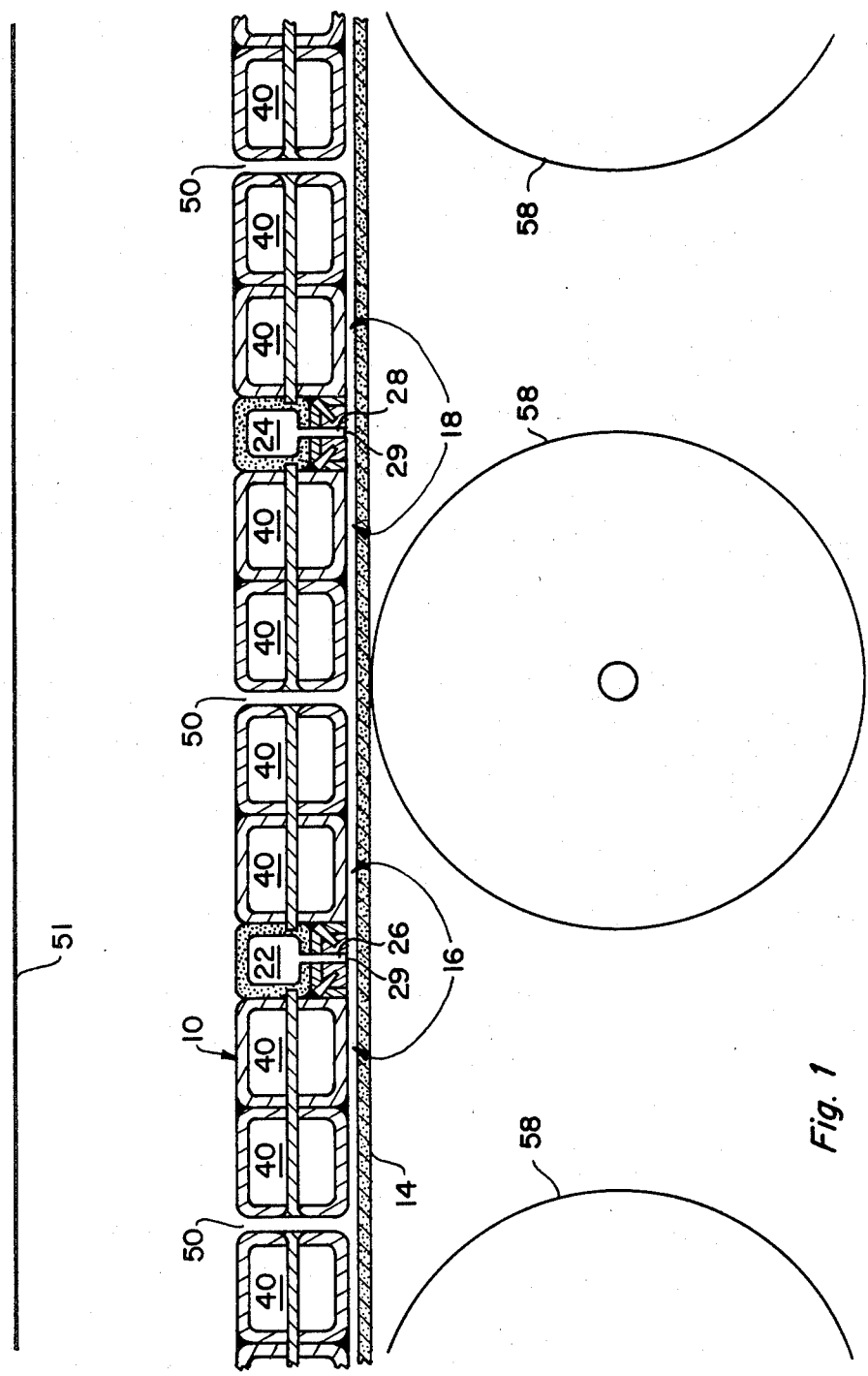
FIG. 1 is a schematic elevation view of apparatus suitable for carrying out the process of the invention.

Referring to FIG. 1, it is seen that coating apparatus 10 is arranged to receive a hot glass sheet 14 along a process line which, for example, can be float-glass-type processing line. Apparatus 10 comprises a first coating-reactor zone 16, and a second coating-reactor zone 18. Coating reactor zones 16 and 18 are supplied with fluid reaction mixture via gas inlet manifolds 22 and 24, respectively and gas feed orifices 26 and 28 respectively. In each such orifice is a thin apertured screen 29, providing enough flow resistance, e.g. pressure equal to a few inches of water, to provide good gas distribution. The reactant mixture is so selected that it deposits a thin—usually ¼ wavelength in optical thickness—coating of the appropriate refractive index, as disclosed in U.S. Pat. No. 4,187,336, for the manufacture of non-iridescent coatings. The gas flow rate for the reaction mixture is selected to be substantially depleted by the time they reach the end of the flow path between the glass and the coater.

The overall length of the apparatus from gas inlet to gas outlet is conveniently selected to be about 6 inches. The apparatus is suspended from, or mounted on, conventional support structure, not shown in the drawings. The reaction rates and other reaction zone conditions are substantially improved by maintaining those surfaces of apparatus 10 which are in the reaction zone at a relatively low temperature to inhibit deposition of coating material thereon and to moderate the reaction speed. Thus, cooling fluid, usually air, is fed into cooling chambers 40, each associated with a reaction zone. The apparatus is suitably positioned to provide about a 0.15-inch height for the gas flow between the glass substrate and the coater surface. Outlet gas escapes from the reaction zone at egress ports 50. Rollers 58 support the glass as it moves along the processing line in the manner well-known in the glass-making industry.

EXAMPLE 1

A clear transparent coating of homogeneous refractive index about 1.67 is applied to glass at a temperature of about 580° C., by flowing over the glass surface a gas mixture with the following composition (in mole percent of the gas):

methoxypentamethyldisilane, $Me_5Si_2OMe$: 0.4%
tetramethyltin, $Me_4Sn$: 0.8%
dry air: balance.

The apparatus is as described in FIG. 1. The lower surface of the coater is controlled at a temperature of about 300° C. A coating about 800 angstrom thick is deposited in about 10 seconds. The flow rate of the gas mixture is adjusted so that any particular volume of gas remains in reaction zone for about 0.1 second.

A coating of fluorine-doped tin oxide is then applied on top of the silica-silicone-tin oxide coated glass, by passing the glass under an identical adjacent coater through which the following mixture is flowing:

tetramethyltin, $Me_4Sn$: 1.8%
bromotrifluoromethane, $CF_3Br$: 3.0%
dry air: balance.

A coating of about 0.25 micron thick is deposited, under the same conditions of temperature, time and flow rate as for the first coating.

The resulting coated glass is clear and colorless in both transmission and reflection. It shows an infrared reflectivity of 85% at a wavelength of 10 microns, and an electrical sheet resistance of 20 ohms per square.

EXAMPLE 2

Another suitable combination of coating reaction mixtures may be applied as follows, and comprises a first mixture of relatively low refractive index applied in zone 16, and a second mixture of relatively high refractive index applied in zone 18.

The first mixture comprises:

|  | Volume % |
|---|---|
| Me₄Sn | 0.5 |
| Me₅Si₂(OMe) | 0.5 |
| dry air | balance |

The second mixture comprises:

|  | Volume % |
|---|---|
| Me₄Sn | 1.8 |
| Me₅Si₂(OMe) | 0.2 |
| dry air | balance |

The glass travels about 10 centimeters per second through the zone, entering the zone at about 580° C. The gas mixtures each enter at a rate suitable to obtain a dwell time of about 0.1 second in the reactor. The surface of the reaction zone suspended above the glass is maintained at about 300° C.

Figure 2:
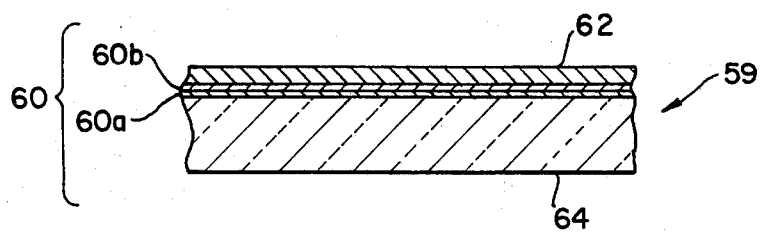
FIG. 2 is a schematic drawing of a coated glass sheet prepared according to the invention.
Figure 3:
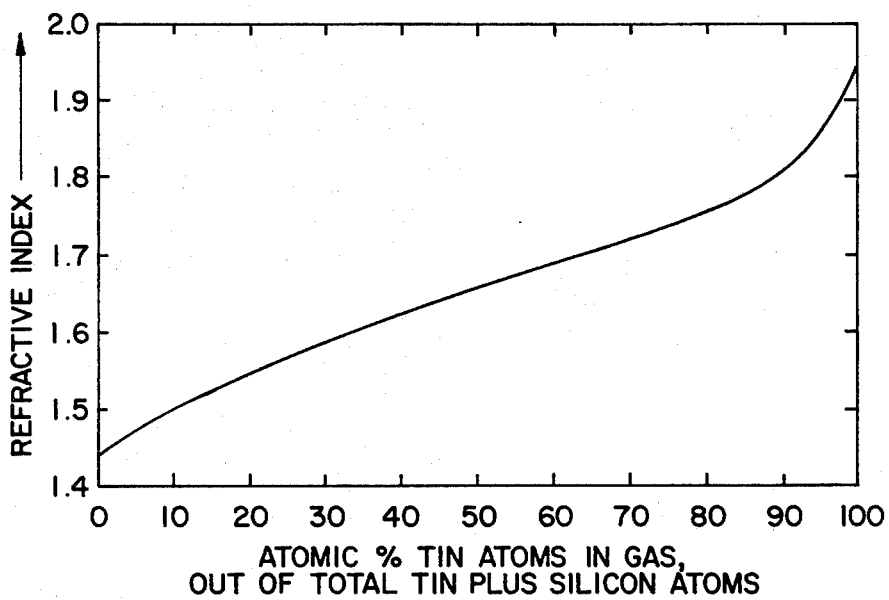
FIG. 3 is a graph of coating refractive index versus gas composition.

FIG. 2 represents a glass product 59 which is first coated according to the invention to have a dual precoating 60 between a glass substrate 64 and a thin tin-oxide coating 62. Each coating has an optical thickness of about ¼ wavelength to optimize the noniridescence of a tin oxide coating of, e.g., about 0.3 microns thickness.

EXAMPLE 3

A clear transparent coating of refractive index about 1.44 is applied to glass at a temperature of about 600° C. by flowing over the glass surface a gas mixture with the following composition:
methoxypentamethyldisilane, Me₅Si₂OMe: 0.4%
dry air: balance
Application is made as described in Example 1. A coating about 600 angstrom thick is formed in ten seconds.

A 0.25 micron thick coating of fluorine-doped tin oxide is then applied on top of the silica-silicone coated glass, as described in Example 1. The resulting coated glass is clear but strongly rose-colored in reflection and slightly green-tinted in transmission. The electrical and infrared properties are similar to those of Example 1.

EXAMPLE 4

This example illustrates the value of compounds of dialkoxy compounds. These react somewhat more rapidly than the tetraethyl tin co-reactant and therefore are particularly useful in forming coatings with gradients in respect to composition and refractive index. A clear transparent coating is formed with a gradient in its refractive index from about 1.55 to 1.9, with a lower refractive index value (1.55) at the glass-coating interface, and the higher refractive index value (1.9) at the outer surface of the coating. The apparatus used is described in U.S. Pat. No. 4,206,252, FIG. 4. A unidirectional flow of reactant gas mixture:
dimethoxytetramethyldisilane, Me₄Si₂(OMe)₂: 0.35%
tetramethyltin, Me₄Sn: 1.0%
dry air: balance
is flowed into the 25 cm long reaction zone at a speed of about 250 cm/sec. along a 580 degree glass surface, in the same direction in which the glass is moving. With a reaction time of about 12 seconds, a gradient layer of about 1,100 angstrom thick forms.

A subsequent coating of fluorine-doped tin oxide is deposited as in Example 1. The coated glass appears clear and colorless, and has the same electrical and infrared properties as in Example 1.

It is also to be understood that the following claims are intended to cover all of the generic and specific features of the invention herein described and all statements of the invention which might be said to fall therebetween.

What is claimed is:

1. In a process for making a silicon-oxide-bearing, transparent coating by reacting (a) silicon-bearing gas at elevated temperatures with (b) a gaseous oxidizing agent for oxidizing said silicon at the hot surface of an article to be coated, the improvement wherein said silicon-bearing gas comprises at least one silicon-bearing compound of the formula $$R(R_2Si)_nOR$$

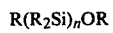

wherein R is any lower alkyl and n is any integer from 2 to about 10.

2. A process as defined in claim 1 wherein n is 2 to 6.

3. A process as defined in claim 2 wherein R is methyl.

4. A process as defined in claims 1, 2, or 3 wherein the reaction is carried out at temperatures above 570° C.

5. A process as defined in claims 1, 2 or 3 wherein the reaction is carried out with reaction mixtures having an initial concentration of above 0.4% of said silicon-bearing compound.

6. A process as defined in claims 1, 2 or 3 wherein the reaction is carried out at temperatures above 570° C. and with reaction mixtures having an initial concentration of above 0.4% of said silicon-bearing compound.

7. A process as defined in claims 1, 2 or 3 wherein n is 2 to 6, wherein the reaction is carried out at a temperature above 570° C.

8. A process as defined in claims 1, 2 or 3 wherein, additionally, oxidizable tin-bearing gas is admixed with said silicon-bearing gas and wherein tin is co-deposited is said coating with said silicon.

9. A process as defined in claims 1, 2 or 3 wherein, additionally, an oxidizable tin-bearing gas is admixed with said silicon-bearing gas and wherein tin is co-deposited in said coating with said silicon and wherein said coating is carried out at temperatures above 570° C.

10. A process as defined in claims 1, 2 or 3 wherein said silicon-bearing compound is Me₅Si₂OMe.

11. A process as defined in claims 1, 2 or 3 wherein the coating deposition rate is between 60 and 150 angstroms per second.

12. A process as defined in claims 1, 2 or 3 wherein the reaction is carried out at temperatures above 570° C. or with reaction mixtures having an initial concentration of above 0.4% of said silicon-bearing compound, and wherein the coating deposition rate is between 60 and 150 angstroms per second.

13. In a process for making a silicon-oxide-bearing, transparent coating by reacting (a) silicon-bearing gas at elevated temperatures with (b) a gaseous oxidizing agent for oxidizing said silicon at the hot surface of an article to be coated, the improvement wherein said silicon-bearing gas comprises at least one silicon-bearing compound of the formula $$RO(R_2Si)_nOR$$

wherein R is any lower alkyl and n is any integer from 2 to about 10.

14. A process as defined in claim 13 wherein n is 2 to 6.

15. A process as defined in claim 14 wherein R is methyl and n is 2.

16. A process as defined in claims 13, 14 or 15 wherein the reaction is carried out at temperatures above 570 degrees C.

17. A process as defined in claims 13, 14 or 15 wherein the reaction is carried out with reaction mixtures having an initial concentration of above 0.4% of said silicon-bearing compound.

* * * * *